US009507051B2

(12) United States Patent
Zhang et al.

(10) Patent No.: US 9,507,051 B2
(45) Date of Patent: Nov. 29, 2016

(54) PHOTOELECTRIC SWITCH FOR DETECTION OF AN OBJECT AND METHOD FOR OPERATING THE SAME (71) Applicant: NUCTECH COMPANY LIMITED, Beijing (CN)

(72) Inventors: Jinyu Zhang, Beijing (CN); Lei Liao, Beijing (CN); Hui Ding, Beijing (CN); Hu Tang, Beijing (CN); Li Zhang, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 0 days.

(21) Appl. No.: 14/577,446

(22) Filed: Dec. 19, 2014

(65) Prior Publication Data

US 2015/0185359 A1 Jul. 2, 2015

(30) Foreign Application Priority Data

Dec. 26, 2013 (CN) .......................... 2013 1 0739805

(51) Int. Cl.
G01J 5/02 (2006.01)
G01V 8/24 (2006.01)
(Continued)

(52) U.S. Cl.
CPC ................ *G01V 8/24* (2013.01); *F16P 3/144* (2013.01); *H03K 17/943* (2013.01); *H03K 2217/94026* (2013.01); *H03K 2217/94112* (2013.01)

(58) Field of Classification Search
CPC ...................................................... G01S 17/026
See application file for complete search history.

(56) References Cited

U.S. PATENT DOCUMENTS 4,343,991 A 8/1982 Fujiwara et al.
4,405,858 A 9/1983 Spratte
4,650,278 A * 3/1987 Maciejko ............. G02B 6/2804
385/15

(Continued)

FOREIGN PATENT DOCUMENTS

CN 202073676 U * 12/2011
DE 198 52 754 A1 5/2000
(Continued)

OTHER PUBLICATIONS

Extended European Search Report dated Aug. 31, 2015, issued in counterpart European Patent Application No. 14199086.1 (11 pages).

(Continued)

*Primary Examiner* — Kiho Kim
(74) *Attorney, Agent, or Firm* — Westerman, Hattori, Daniels & Adrian, LLP (57) ABSTRACT A photoelectric switch for detection of an object. The photoelectric switch comprises: a light transmitter unit comprising plural light transmitters configured to emit plural light signals; a light receiver unit comprising plural optical fiber receivers in one-to-one correspondence with the plural light transmitters and configured to receive the plural light signals and to merge plural light signals, wherein an object detection area is defined between the plural light transmitters and the plural optical fiber receivers; a photoelectric conversion unit connected to the optical fiber receivers and configured to perform photoelectric conversions on the merged light signals outputted by the optical fiber receivers so as to generate an electric signal; and a control and processing unit connected to both the light transmitter unit and the photoelectric conversion unit, and configured to control and process the light signals and/or the electric signal.

3 Claims, 5 Drawing Sheets (51) Int. Cl.
*F16P 3/14* (2006.01)
*H03K 17/94* (2006.01)

(56) References Cited

U.S. PATENT DOCUMENTS

| | | | |
|---|---|---|---|
| 5,064,267 A | | 11/1991 | Rossberg |
| 5,077,467 A | * | 12/1991 | Barron et al. ................. 250/221 |
| 5,880,462 A | | 3/1999 | Hsia |
| 2011/0313299 A1 | * | 12/2011 | Brennan, III ................. 600/478 |

FOREIGN PATENT DOCUMENTS

| | | | | |
|---|---|---|---|---|
| JP | 04072812 A | * | 3/1992 | ............. H03K 17/78 |
| JP | 07261911 A | * | 10/1995 | ............... G06F 3/03 |

OTHER PUBLICATIONS

Partial European Search Report (R. 64 EPC) dated May 8, 2015, issued in counterpart European Patent Application No. 14199086.1 (6 pages).

* cited by examiner

PHOTOELECTRIC SWITCH FOR DETECTION OF AN OBJECT AND METHOD FOR OPERATING THE SAME

CROSS-REFERENCE TO RELATED APPLICATION

This application claims the benefit of Chinese Patent Application No. 201310739805.3 filed on Dec. 26, 2013 in the State Intellectual Property Office of China, the whole disclosure of which is incorporated herein by reference.

BACKGROUND OF THE INVENTION

1. Field of the Invention

Embodiments of the present invention relates to security inspection equipment, and in particular to a photoelectric switch for detection of an object, used in security inspection equipment, and a method for operating the photoelectric switch.

2. Description of the Related Art

In conventional security inspection equipment, photoelectric switch for detection of an object is used to judge if an object exists in a detection area or not. Generally, there is one-to-one correspondence between the transmitter tubes and the receiver tubes in conventional photoelectric switch. As a result, more is the transmitter tubes, more is the receiver tubes. This causes numerous components and bulky size. Furthermore, due to differences in performance among these transmitter tubes, these receiving signals have a bad consistency, which adversely affects performance of the subsequent amplification circuit, thereby degrading performance of the whole system.

Moreover, as to algorithm applied in operations of the conventional photoelectric switch, these photoelectric receiving operations are running in binary, that is, a fixed threshold is predefined and on/off of the blocked state would be changed once it goes beyond the threshold. However, in practical application, transmissions and receptions of infrared lights are highly negatively affected by environmental lights, such as sunlight and lamplight, and correspondingly false operation is easy to appear when the environment is not good.

In addition, in the design of conventional photoelectric switch, due to fixed intervals among plural transmitter tubes, a resolution for detection is non-adjustable

SUMMARY OF THE INVENTION

In accordance with an aspect of the present invention, there is provided a photoelectric switch for detection of an object, the photoelectric switch comprising:
a light transmitter unit comprising plural light transmitters configured to emit plural light signals;
a light receiver unit comprising plural optical fiber receivers in one-to-one correspondence with the plural light transmitters and configured to receive the plural light signals and to merge plural light signals, wherein an object detection area is defined between the plural light transmitters and the plural optical fiber receivers;
a photoelectric conversion unit connected to the optical fiber receivers and configured to perform photoelectric conversions on the merged light signals outputted by the optical fiber receivers so as to generate an electric signal; and
a control and processing unit connected to both the light transmitter unit and the photoelectric conversion unit, and configured to control and process the light signals and/or the electric signal. In accordance with another aspect of the present invention, there is provided a method for operating the abovementioned photoelectric switch, the method comprising:
emitting, by plural light transmitters, plural light signals;
receiving, by plural optical fiber receivers, the plural light signals and to merge the plural light signals, wherein an object detection area is defined between the plural light transmitters and the plural optical fiber receivers;
performing, by a photoelectric conversion unit, photoelectric conversions on the merged light signals outputted by the optical fiber receivers so as to generate an electric signal; and
controlling and processing, by a control and processing unit, the light signals and/or the electric signal.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments are provided so that the present invention will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

First Overall Architecture

Figure 1:
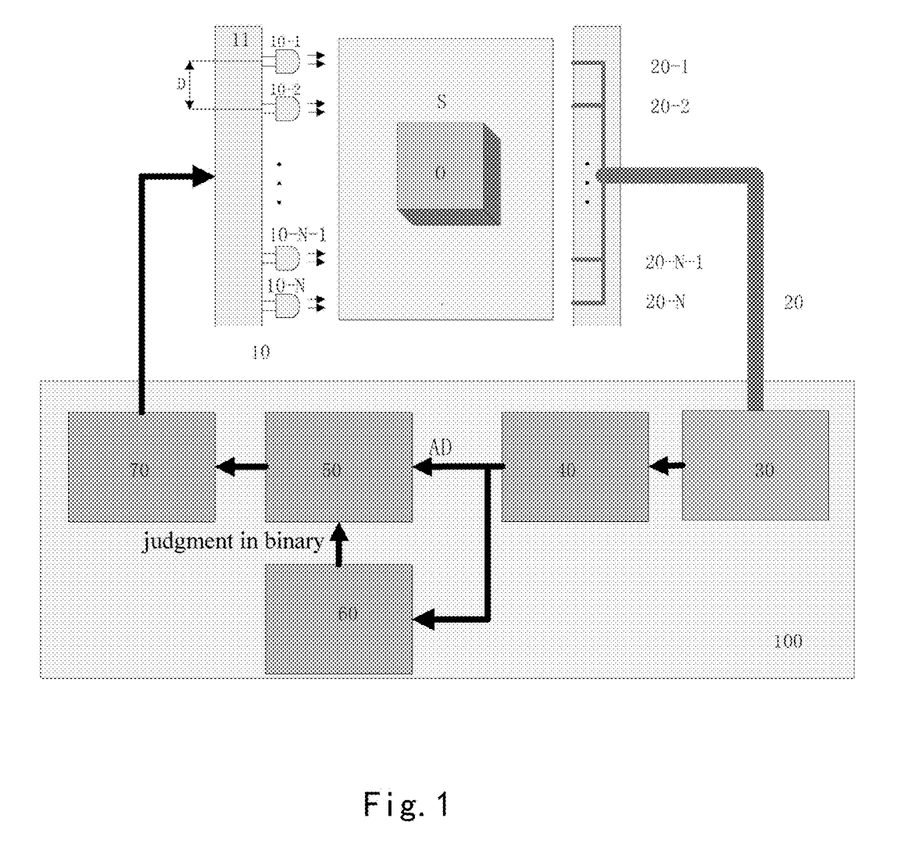
FIG. 1 is a schematic diagram showing overall architecture of a photoelectric switch for detection of an object according to an embodiment of the present invention.

Referring to FIGS. 1-4 and 6, a photoelectric switch for detection of an object O within an object detection area S is provided. As shown in FIG. 1, the photoelectric switch comprises a light transmitter unit 10, a light receiver unit 20, a photoelectric conversion unit 30, and a control and processing unit. The light transmitter unit 10 comprises plural light transmitters 10-1, 10-2, . . . , 10-N configured to emit plural light signals. The light receiver unit 20 comprises plural optical fiber receivers 20-1, 20-2, . . . , 20-N arranged in one-to-one correspondence with the plural light transmitters. The object detection area S is defined between the plural light transmitters and the plural optical fiber receivers. The plural optical fiber receivers 20-1, 20-2, . . . , 20-N are configured to receive the plural light signals and to merge the received plural light signals. Specifically, each of the plural optical fiber receivers 20-1, 20-2, . . . , 20-N has one end configured to receive a path of light from the corresponding light transmitter and the other end fused into a single optical fiber outputting end. In the light receiver unit 20 according to embodiments of the present invention, the plural optical fiber receivers 20-1, 20-2, . . . , 20-N may comprise plural light receiving ends configured to receive the light signals emitted by the respective light transmitters 10-1, 10-2, . . . , 10-N and a single light outputting end configured to merge the received plural light signals. In one embodiment of the present invention, the single light outputting end may be formed by fusing the plural optical fiber receivers into a single optical fiber using an optical fiber fusion technology. In another embodiment of the present invention, the single light outputting end may be formed by gathering the plural optical fiber receivers into a cluster of optical fibers. As a result, by use of the plural optical fiber receivers, the received light signals are merged. The photoelectric conversion unit 30 is connected to the single light outputting end of the plural optical fiber receivers 20-1, 20-2, . . . , 20-N, and the photoelectric conversion unit 30 is configured to perform photoelectric conversions on the merged light signals outputted by the optical fiber receivers 20-1, 20-2, . . . , 20-N so as to generate an electric signal.

Referring to FIG. 1, the control and processing unit is connected to both the light transmitter unit 10 and the photoelectric conversion unit 30, and the control and processing unit is configured to control and process the light signals and/or the electric signal. As shown in FIG. 1, the control and processing unit comprises a driving control circuit 70, an amplification circuit 40, a microcontroller 50, and a demodulation circuit 60. The driving control circuit 70 is connected to the light transmitter unit 10 and is configured to control triggering of the plural light transmitters 10-1, 10-2, . . . , 10-N. The amplification circuit 40 is connected to the driving control circuit 70 and is configured to amplify the electric signal outputted by the photoelectric conversion unit 30. The microcontroller 50 is connected to the amplification circuit 40 and is configured to perform an analog-digital conversion and processing on the amplified electric signal and to generate a driving signal which is to be transmitted to the driving control circuit 70 so as to drive triggering of the plural light transmitters 10-1, 10-2, . . . , 10-N. The demodulation circuit 60 is connected between the driving control circuit 70 and the microcontroller 50 and is configured to perform a demodulation processing on the amplified electric signal.

Specifically, the amplification circuit 40 is used to amplify the weak electric signal outputted from the photoelectric conversion unit 30 and perform noise elimination and filtering processing on the electric signal so as to output amplified analog signals. On one hand, one amplified analog signal is transmitted to the microcontroller 50, and in the microcontroller 50, an analog-digital (AD) conversion is performed on the one amplified analog signal and then an algorithm processing (referring to the flowchart of algorithm described later) is performed on a converted digital value. On the other hand, another amplified analog signal is transmitted to the demodulation circuit 60, and in the demodulation circuit 60, a demodulation processing in which demodulation and removal of the carrier signal are performed is performed on the another amplified analog signal in order to obtain a modulated signal. Further, in the demodulation circuit 60, it is judged whether the modulated signal reaches a predefined judging threshold or not, and then the judgment result in binary is transmitted to the microcontroller 50. The microcontroller 50 takes in charge of not only generation of control logic of the whole photoelectric switch, but also implementation of operations including but not limited to, to perform the AD conversion on the amplified signal and then to perform the algorithm processing on the converted digital value, to receive a detection result from the demodulation circuit 60, to generate a driving signal (preferably a pulse-width modulation (PWM) signal) to be transmitted to the driving control circuit 70, and to achieve synchronization between transmission and reception of optical signals. For example, in some embodiments of the present invention, the microcontroller 50 may be configured to perform a comparison of a digital value obtained in the analog-digital conversion and a signal value obtained in the demodulation processing with a predefined judging threshold, to determine whether a blocked state indicating presence of an object is outputted or not. In some other embodiments of the present invention, the microcontroller 50 may be configured to determine whether to update the judging threshold based on the digital value obtained in the AD conversion and the signal value obtained in the demodulation processing or not, furthermore, the microcontroller 50 may further be configured to update the judging threshold based on the digital value obtained in the AD conversion and the signal value obtained in the demodulation processing. In some other embodiments of the present invention, the microcontroller 50 may be configured to perform the AD conversion and processing on the amplified electric signal and the demodulation processing on the amplified electric signal simultaneously. In addition, the driving control circuit 70 takes in charge of generation of control logic of triggering of the plural light transmitters 10-1, 10-2, . . . , 10-N.

In a preferable embodiment of the present invention, the light transmitters 10-1, 10-2, . . . , 10-N comprise infrared light emitting diodes, and, the photoelectric conversion unit 30 preferably comprises an infrared light receiver tube. In a preferable embodiment, the light transmitter unit 10 may further comprise a light transmitter driving board 11 on which the plural light transmitters 10-1, 10-2, . . . , 10-N are arranged at equal distance D; and the distance D is adjustable. In a preferable embodiment, these light transmitters 10-1, 10-2, . . . , 10-N are arranged in a linear manner, while, these optical fiber receivers 20-1, 20-2, . . . , 20-N are arranged in a linear manner, correspondingly. In a preferable embodiment, the driving control circuit 70, the amplification circuit 40, the microcontroller 50 and the demodulation circuit 60 are disposed on a control board 100.

Second Workflow

Figure 2:
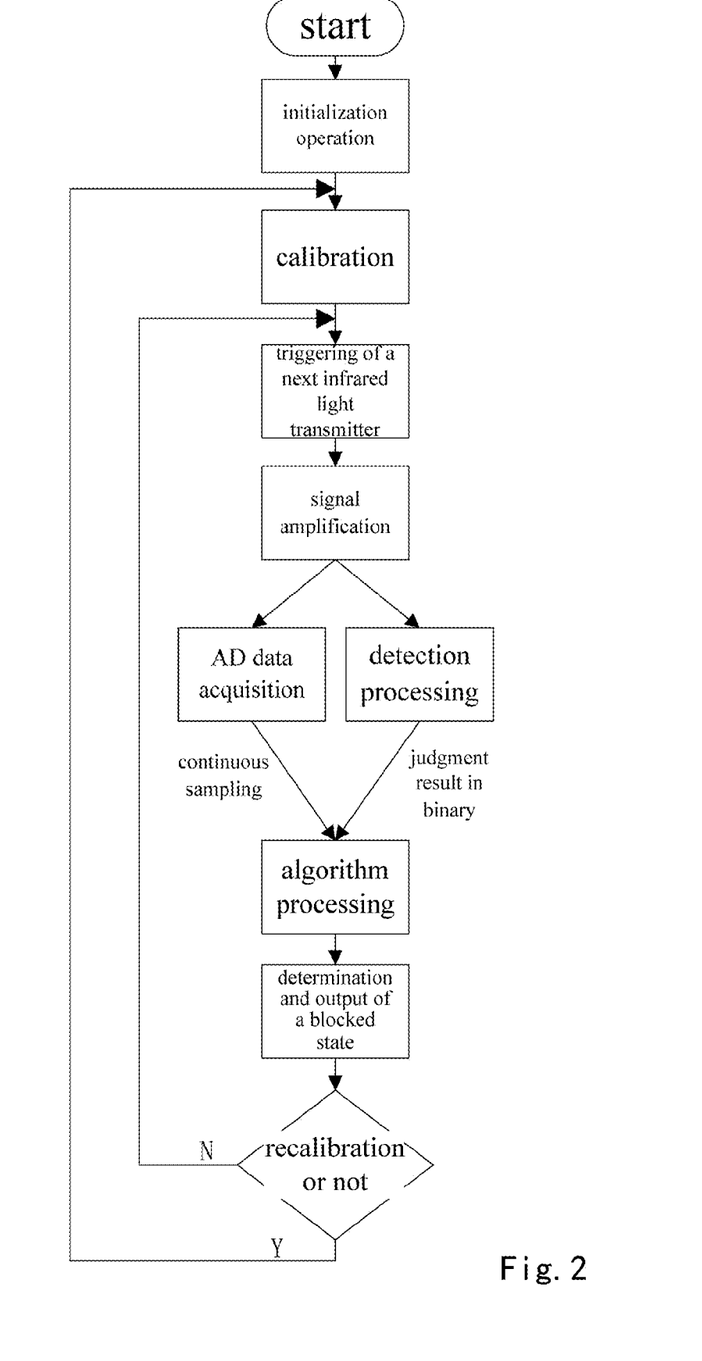
FIG. 2 is a workflow chart of operations of the photoelectric switch according to an embodiment of the present invention.

FIG. 2 is a workflow chart of the photoelectric switch according to an embodiment of the present invention. As shown in FIG. 2, first of all, the photoelectric switch is started and a necessary initialization operation is performed and the predefined threshold is calibrated by the microcontroller (MCU) 50. Subsequently, the driving control circuit 70 drives a first light transmitter (namely, a first infrared light emitting diode) 10-1 to emit a light signal, and the light signal passes through a path of light and is received by a optical fiber receiver 20-1 and then is converted in the photoelectric conversion unit (infrared receiver tube) 30 into an electric signal. Then, the electric signal is amplified in the amplification circuit 40 to output amplified analog signals. Here, one amplified analog signal is transmitted to the microcontroller 50, and in the microcontroller 50, an analog-digital (AD) conversion is performed on the one amplified analog signal, while, another amplified analog signal is transmitted to the demodulation circuit 60, and in the demodulation circuit 60, a demodulation processing is performed on the another amplified analog signal that is to be transmitted to the microcontroller 50. In the microcontroller 50, an algorithm processing is performed based on a digital value obtained in the analog-digital conversion and a signal value obtained in the demodulation processing, to determine whether or not the path of light transmitted by the abovementioned infrared light emitting diode to the infrared receiver tube is in a blocked state where the path of light transmitted by the abovementioned infrared light emitting diode to the infrared receiver tube is blocked and output the determined result. After completing the abovementioned procedures, another round of abovementioned procedures is repeated, for example, a next infrared light emitting diode 10-2 is driven to emit a light signal, an analog-digital conversion is performed, and an demodulation processing is performed, etc., until the last round of abovementioned procedures is repeated for the last infrared light emitting diode 10-N. After that, triggering of the infrared light emitting diodes are stopped, while the analog-digital conversion and data processing are repeatedly performed to acquire a background signal for current environmental light and thus a current environment state will be obtained, in order to judge whether there is an object O or not. Moreover, after completing each round of the abovementioned procedures, a comparison of an integration of the digital value obtained in the analog-digital conversion and the signal value obtained in the demodulation processing with a current defined judging threshold is performed, in order to determine whether it is necessary to recalibrate the judging threshold or not. If yes, to calibrate the judging threshold, and if no, to perform a detection operation for next path of light.

Figure 3:
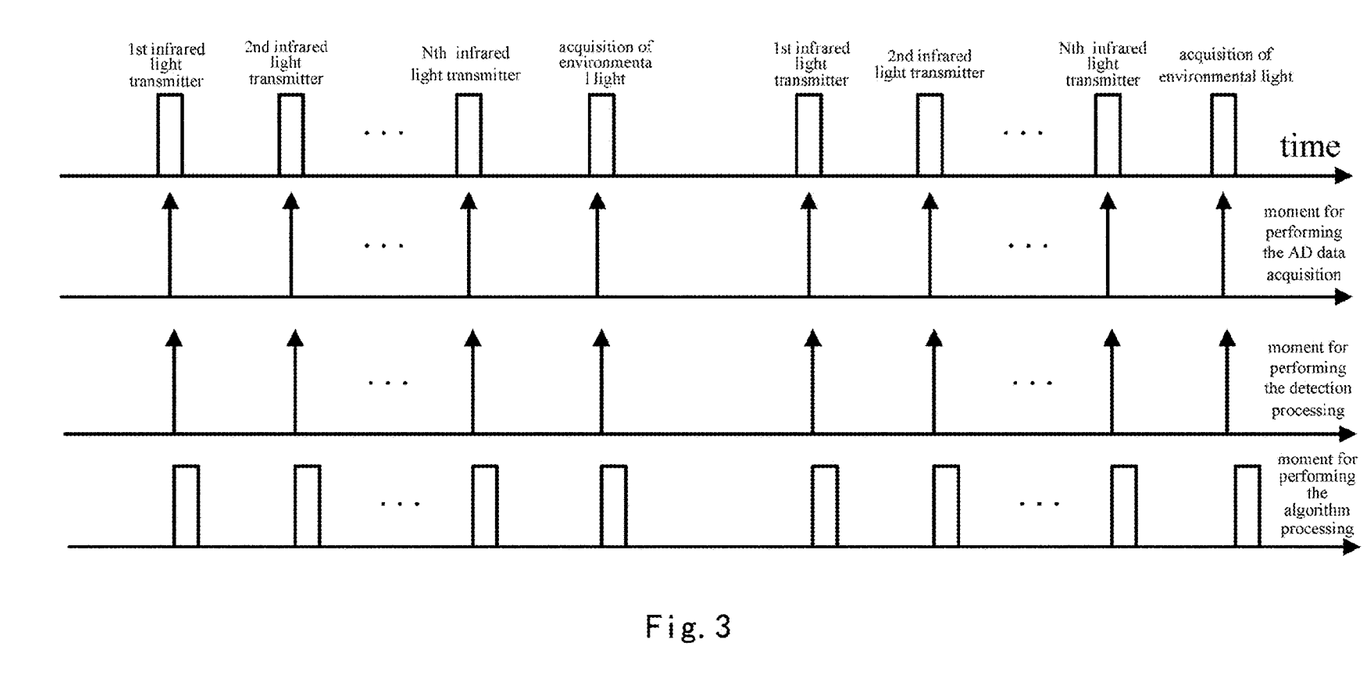
FIG. 3 is a schematic diagram showing the workflow chart of operations of the photoelectric switch according to an embodiment of the present invention, in a chronological order.

FIG. 3 is a schematic diagram showing the flow chart of operations of the photoelectric switch according to an embodiment of the present invention, in a chronological order. As shown in FIG. 3, in the chronological order, first, second, . . . , Nth infrared transmitters are driven successively to emit light signals, at predefined time intervals. Then, to acquire a background signal for environmental light. For example, the first infrared light transmitter is driven to emit a light signal and a photoelectric conversion is performed so as to obtain amplified analog electric signals. One amplified analog electric signal is transmitted to the microcontroller 50, and in the microcontroller 50, an analog-digital (AD) conversion is performed on the one amplified analog electric signal, while, another amplified analog electric signal is transmitted to the demodulation circuit 60, and in the demodulation circuit 60, a demodulation processing is performed on the another amplified analog electric signal. Then, in the microcontroller 50, an algorithm processing is performed based on a digital value obtained in the analog-digital conversion and a signal value obtained in the demodulation processing.

Third Flowchart Of Algorithm

Figure 4:
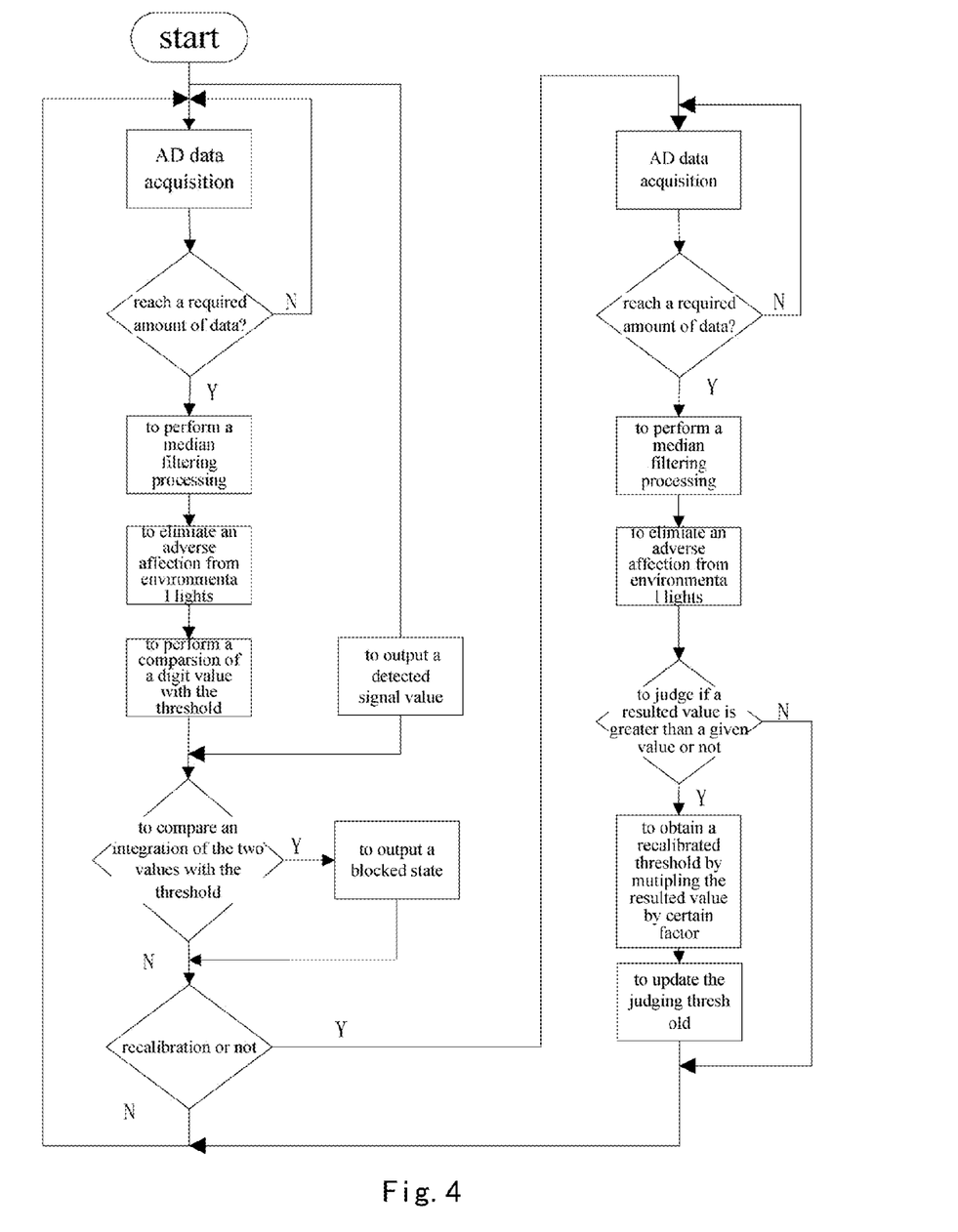
FIG. 4 is a flow chart of an algorithm applied in operations of the photoelectric switch according to an embodiment of the present invention.

FIG. 4 is a flow chart of algorithm process applied in the photoelectric switch according to an embodiment of the present invention. After an amplification processing performed in the amplification circuit 40, an AD data acquisition is performed for one amplified electric signal in the microcontroller 50. Once an amount of the acquired data reaches a preset amount, a median filtering processing on the acquired data is performed. Meanwhile, to end triggering of these infrared transmitter tubes while repeatedly performing the AD data acquisition and data processing to acquire a background signal for current environmental light, and then to remove adverse effect of the environmental light from a result of the median filtering processing, and then the resulted data value is brought to be compared with the predefined judging threshold. On the other hand, a demodulation processing on the other amplified electric signal is performed in the demodulation circuit 60 in order to obtain a modulated signal value. Then, a digital value obtained in the AD data acquisition and a signal value obtained in the demodulation processing are integrated into a resulted value. After that, to judge if the resulted value goes beyond the threshold, if yes, a blocked state is outputted; and if no, to judge if it is required to recalibrate the threshold. In case that it is required to recalibrate the threshold, the AD data acquisition and the median filtering processing are performed in the microcontroller 50 while the adverse effect of the environmental light is removed. Thereafter, to judge if the resulted value is greater than a given constant value, if yes, to multiply this resulted value by a certain factor in order to obtain a new threshold to replace the predefined one, and if no, no recalibration of the threshold is performed.

With the abovementioned algorithm process, the photoelectric switch according to the embodiments of the present invention is able to remove adverse effect of the environmental light, and, the judging threshold varies when the environment changes. Accordingly, it not only is suitable for various operation conditions, but also improves the stability and liability.

Figure 5:
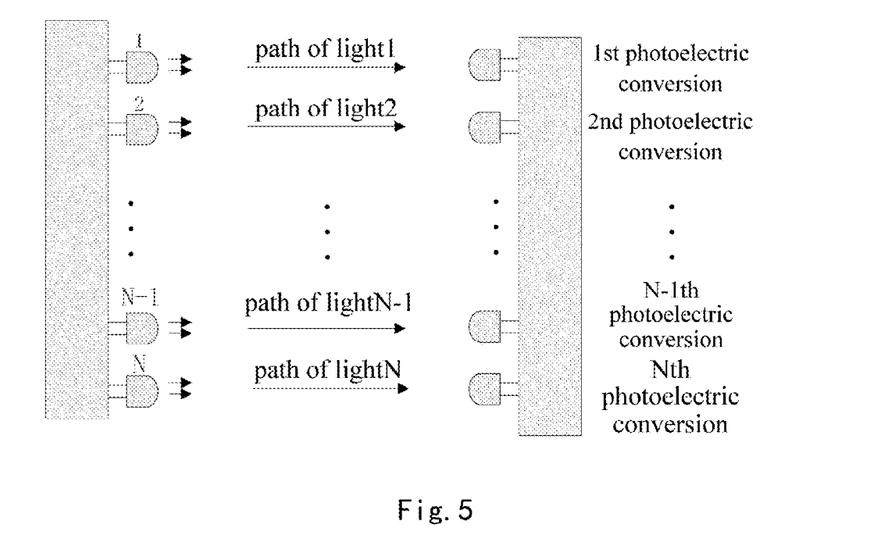
FIG. 5 is a schematic diagram showing architecture of a conventional photoelectric switch.

Fourth Advantages of Photoelectric Switch According to Embodiments of the Present Invention 1. Processing Mode of Optical Receival Referring to FIG. 5, in the design of conventional photoelectric switch, generally, there is one-to-one correspondence between the transmitter tubes and the receiver tubes and photoelectric conversion is performed in every receiver tube. That is, plural optical receiving carriers are provided in one photoelectric conversion receiving device, and, plural optical signals match with plural electric signals, respectively. As a result, more is the transmitter tubes, more is the receiver tubes. It leads to a bad consistency among these received signals due to differences in performance among these transmitter tubes, which adversely affects performance of the subsequent amplification circuit, thereby degrading performance of the whole system.

Figure 6:
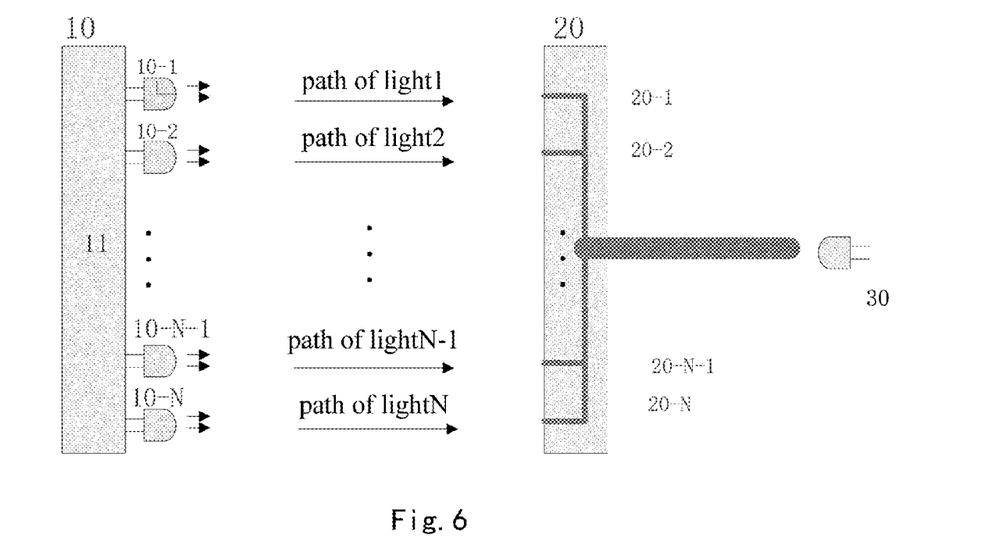
FIG. 6 is a schematic diagram showing architecture of a photoelectric switch according to an embodiment of the present invention.

According to these embodiments of the present invention, as shown in FIG. 6, plural optical signals are merged and then photoelectric conversions on the merged optical signals are performed by use of plural optical fibers as optical receiving carriers, while remaining the design of the transmitter tubes. In this way, in the design of photoelectric switch according to these embodiments of the present invention, only one receiver tube is used as the photoelectric conversion carrier. As a result, the adverse effect brought by differences in performance among these receiver tubes will be eliminated, performance of the photoelectric switch is improved, and, overall cost is reduced.

2. Expandable Architecture

According to these embodiments of the present invention, there provides an open architecture for the photoelectric switch. That is, in those practical application, it only needs to simply add or reduce numbers N of infrared transmitter tubes and optical fiber receivers, in order to enlarge or reduce the detection area. Moreover, it only needs to simply decrease or increase a distance D among these infrared transmitter tubes, in order to enhance or reduce resolution for detection. As a result, the photoelectric switch according to these embodiments of the present invention has great development, expansibility and adaptability in architecture.

3. Advantages in Size

Conventional photoelectric switch, due to its numerous components and bulky size caused by one-to-one correspondence between the transmitter tubes and the receiver tubes, is not suitable for applications where require high demands on size and space.

The photoelectric switch according to these embodiments of the present invention, however, adopts a configuration in which plural optical signals are merged into one single end of the receivers, which greatly reduces its occupied space such that it is suitable for applications where small-sized equipment is required or where there has a narrow space.

4. Adaptive Processing Algorithm

In conventional photoelectric switch, these photoelectric receiving operations are running in binary, that is, a fixed threshold is predefined and on/off of the blocked state would be changed once beyond the threshold. However, in practical application, transmission and reception of infrared lights are highly affected by environmental lights such as sunlight and lamplight and correspondingly false operation is easy to appear when the environment is not good.

The photoelectric switch according to these embodiments of the present invention, in the processing algorithm, performs a binary judgment on the received signals by the demodulation circuit, and performs an AD data acquisition and an data processing on the received signals with a microcontroller, adopts an adaptive tracking by specific algorithm on current light environment, and, judges the on/off of the blocked state of optical light paths, in combination with results of processing two signal paths. As a result, adverse affection from environmental lights is eliminated. In addition, the judging threshold is adjustable according to the changed environments, so that it is suitable to different operational environments and the stability and reliability are improved.

5. Range of Use of the Photoelectric Switch According to These Embodiments of the Present Invention The photoelectric switch for detection of an object according to these embodiments of the present invention is able to be applied in the conventional security inspection equipment to achieve a stable and reliable operation. Moreover, the photoelectric switch for detection of an object according to these embodiments of the present invention is able to perform accurate detections on these objects, including but not limited to the following items, transparent plastic bottles, thin papers, steel products, liquid bottles, and so on.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. A method for operating a photoelectric switch, comprising:

emitting, by plural light transmitters (10-1, 10-2, . . . , 10-N), plural light signals;

receiving, by plural optical fiber receivers (20-1, 20-2, . . . , 20-N), said plural light signals and, merging said received plural light signals, wherein an object detection area (S) is defined between said plural light transmitters and said plural optical fiber receivers;

performing, by a photoelectric conversion unit (30), photoelectric conversions on said merged light signals outputted by said optical fiber receivers so as to generate an electric signal; and controlling and processing, by a control and processing unit, said light signals and/or said electric signal:

wherein, the step of controlling and processing comprises:

amplifying, by an amplification circuit (40), said electric signal outputted by said photoelectric conversion unit, to form one and the other amplified electrical signals;

performing, by a microcontroller (50), an analog-digital conversion and processing on the one amplified electrical signal, to obtain a digital value; and performing, by a demodulation circuit (60), a demodulation processing on the other amplified electric signal, to obtain a modulated signal value;

wherein, the step of performing an analog-digital conversion and processing further comprises:

performing a median filtering processing on data acquired by an AD data acquisition once an amount of the data acquired reaches a preset amount;

performing again, after ending triggering of these infrared transmitter tubes, the AD data acquisition and processing, to acquire a background signal for current environmental light; and removing the background signal for current environmental light from a result of the median filtering processing.

2. The method according to claim 1, wherein, the step of controlling and processing further comprises:

controlling, by a driving control circuit (70), triggering of said plural light transmitters;

generating a driving signal which is to be transmitted to said driving control circuit.

3. The method according to claim 2, wherein, the step of controlling and processing further comprises:

performing a comparison of the digital value obtained in the analog-digital conversion and processing and the modulated signal value obtained in the demodulation processing with a predefined judging threshold, to determine whether a blocked state indicating presence of an object is outputted or not;

determining whether or not to update the judging threshold, based on the digital value obtained in the analog-digital conversion and processing and the modulated signal value obtained in the demodulation processing if yes, to update the judging threshold; and performing the analog-digital conversion and processing on the one amplified electric signal and the demodulation processing on the other amplified electric signal simultaneously.

* * * * *